(12) United States Patent
Mittal et al.

(10) Patent No.: US 10,651,850 B2
(45) Date of Patent: May 12, 2020

(54) LOW VOLTAGE TOLERANT ULTRA-LOW POWER EDGE TRIGGERED FLIP-FLOP FOR STANDARD CELL LIBRARY

(71) Applicant: SAMSUNG ELECTRONICS CO., LTD., Suwon-si (KR)

(72) Inventors: Sajal Mittal, Bengaluru (IN); Jaskaran Singh Bhatia, New Delhi (IN); Rajeela Deshpande, Bengaluru (IN); Parvinder Kumar Rana, Bengaluru (IN); Nikhila C M, Bengaluru (IN); Abhishek Ghosh, Bengaluru (IN); Rahul Kataria, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/363,292

(22) Filed: Mar. 25, 2019

(65) Prior Publication Data

US 2020/0067507 A1 Feb. 27, 2020

(30) Foreign Application Priority Data

Aug. 23, 2018 (IN) .............................. 201841031682

(51) Int. Cl.
*H03K 19/00* (2006.01)
*H03K 19/0185* (2006.01)
(Continued)

(52) U.S. Cl.
CPC ......... *H03K 19/0013* (2013.01); *H03K 3/012* (2013.01); *H03K 3/0372* (2013.01); *H03K 19/0185* (2013.01)

(58) Field of Classification Search
None
See application file for complete search history.

(56) References Cited

U.S. PATENT DOCUMENTS

| 5,889,422 | A  | * | 3/1999 | Komoike | ............... | H03K 3/012 |
|-----------|----|---|--------|---------|----------------|-----------|
|           |    |   |        |         |                | 327/200    |
| 7,233,172 | B2 | * | 6/2007 | Kanamori | .............. | G11C 7/065 |
|           |    |   |        |         |                | 327/55     |

(Continued)

OTHER PUBLICATIONS

Nicola Dragone et al., "An Innovative Methodology for the Design Automation of Low Power Libraries", Proc. Int. Workshop Power and Timing Models, Optimization and Simulation, PATMOS, 1998, 10 pages.

*Primary Examiner* — Jeffery S Zweizig
(74) *Attorney, Agent, or Firm* — Sughrue Mion, PLLC

(57) ABSTRACT

A method and a flip-flop for designing low power integrated circuits (IC's). The method includes receiving at least one of a clock signal, a data signal, and a complimentary data signal. The complimentary data signal is produced by an input data inverter present in the flip-flop. Further, the method includes generating at least one master internal signal based on the received at least one of the clock signal, the data signal, and the complimentary data signal, when the clock signal is at a low logic level. Further, the method includes generating at least one slave internal signal based on at least one of the received clock signal and the generated at least one master internal signal, when the clock signal is at a high logic level. Further, the method includes generating an output signal based on the generated at least one slave internal signal.

12 Claims, 3 Drawing Sheets

(51) Int. Cl.
*H03K 3/012* (2006.01)
*H03K 3/037* (2006.01)

(56) References Cited

U.S. PATENT DOCUMENTS

| | | | |
|---|---|---|---|
| 8,373,483 B2* | 2/2013 | Dally | H03K 3/356191 |
| | | | 327/199 |
| 8,947,149 B1 | 2/2015 | Kapoor et al. | |
| 9,641,160 B2* | 5/2017 | Agarwal | H03K 3/356008 |
| 9,876,503 B2* | 1/2018 | Vrudhula | H03K 19/0813 |
| 10,250,236 B2* | 4/2019 | Vrudhula | H03K 3/012 |
| 2005/0086621 A1 | 4/2005 | Matsumura et al. | |
| 2017/0061057 A1 | 3/2017 | Lee | |

\* cited by examiner

LOW VOLTAGE TOLERANT ULTRA-LOW POWER EDGE TRIGGERED FLIP-FLOP FOR STANDARD CELL LIBRARY

CROSS REFERENCE TO RELATED APPLICATIONS

This application is based on and claims priority under 35 U.S.C. § 119 to Indian Patent Application No. 201841031682, filed on Aug. 23, 2018, in the Indian Intellectual Property Office, the disclosure of which is incorporated by reference herein in its entirety.

BACKGROUND

1. Field

The disclosure relates to a field of integrated circuits (IC), and more particularly, to a low voltage tolerant ultra-low power edge-triggered master-slave flip-flop for standard cell library.

2. Description of Related Art

The term "flop," or "Flip-flop," is generally used to describe or to refer to a clocked electronic circuit having two stable states, which is used to store a value. A flop generally comprises two latch circuits. Flip-flops have many and varied applications, and are widely used in digital circuits. One important use of Flip-flops is to store bits of an instruction within an instruction pipeline of a central processing unit (CPU) or graphical processing unit (GPU). In a conventional Flip-flop electronic circuit, data is stored in cross-coupled inverters. A first, or "master" latch comprises a pass or transmission gate and a cross-coupled inverter. A second, or "slave" latch similarly comprises a pass gate and a cross-coupled inverter. A clock signal controls the operation of the two pass gates or transmission gates, and hence the operation of the Flip-flop circuit.

Generally, for low power chip designs, there are a number of power components out of which clock power is very critical. The clock power is the major contributor to the total block power and hence optimizing clock power for the Flip-flop designs will reduce the overall block power. However, using conventional stacking technique degrades Flip-flop performance which impacts overall block frequency and increase the total area.

FIG. 1 is a related art Flip-flop circuit diagram, where the master latch uses a related-art jam latch which is not robust in nature. Further, the related art Flip-flop circuit uses large number of single stack inverters, which contributes to high power consumption. A data invertor present in the Flip-flop receive a data signal D and generates a complimentary data signal DN. Further, when a clock (CLK) signal is at low logic and according to the D and DN signals, node N1 and N2 are settled and goes to the slave part. When the CLK goes to high logic, master latch turns off and previous value is retained by the jam latch. According to the nodes N1 and N2, signals Q and QN are generated and it is retained by the jam latch when the CLK goes to low logic.

In view of the foregoing, there is a need to provide a Flip-flop design, which has extremely low clock power with the minimal impact in cell area and performance.

The above-mentioned shortcomings, disadvantages, and problems are addressed herein and which will be understood by reading and studying the following specification.

The above information is presented as background information only to assist with an understanding of the present disclosure. No determination has been made, and no assertion is made, as to whether any of the above might be applicable as prior art with regard to the present disclosure.

SUMMARY

In accordance with an aspect of the disclosure a method and a Flip-flop for designing a low power integrated circuit (IC) are provided. The method includes receiving at least one of a clock signal, a data signal, and a complimentary data signal. The complimentary data signal is produced by an input data inverter present in the Flip-flop. Further, the method includes generating at least one master internal signal based on the received at least one of the clock signal, the data signal, and the complimentary data signal, when the clock signal is at a low logic level. Further, the method includes generating at least one slave internal signal based on at least one of the received clock signal and the generated at least one master internal signal, when the clock signal is at a high logic level. Further, the method includes generating an output signal based on the generated at least one slave internal signal.

According to yet another aspect of the disclosure a method and a Flip-flop for designing a low power integrated circuit (IC) are provided. The method includes receiving at least one of a clock signal, a complimentary clock signal, a data signal, and a complimentary data signal. The complimentary clock signal is produced by a clock inverter present in the Flip-flop. The complimentary data signal is produced by a data inverter present in the Flip-flop. Further, the method includes generating at least one master internal signal based on the received at least one of the clock signal, the complimentary clock signal, the data signal, and the complimentary data signal, when the clock is at a low logic level. Further, the method includes generating at least one slave internal signal based on at least one of the generated at least one master internal signal and the received clock signal when the clock signal is at a high logic level. Further, the method includes receiving the at least one slave internal signal and generating an output signal.

Accordingly to embodiments of the disclosure, a method for designing low power integrated circuits (IC's) using a Flip-flop is provided. The method includes receiving at least one of a clock signal, a data signal, and a complimentary data signal. The complimentary data signal is produced by an input data inverter present in the Flip-flop. Further, the method includes generating at least one master internal signal based on the received at least one of the clock signal, the data signal, and the complimentary data signal, when the clock signal is at a low logic level. Further, the method includes generating at least one slave internal signal based on at least one of the received clock signal and the generated at least one master internal signal, when the clock signal is at a high logic level. Further, the method includes generating an output signal based on the generated at least one slave internal signal.

According to the embodiments of the disclosure a method for designing low power integrated circuits (IC's) using a Flip-flop is provided. The method includes receiving at least one of a clock signal, a complimentary clock signal, a data signal, and a complimentary data signal. The complimentary clock signal is produced by a clock inverter present in the Flip-flop. The complimentary data signal is produced by a data inverter present in the Flip-flop Further, the method includes generating at least one master internal signal based on the received at least one of the clock signal, the complimentary clock signal, the data signal, and the complimentary data signal, when the clock is at a low logic level. Further, the method includes generating at least one slave internal signal based on at least one of the generated at least one master internal signal and the received clock signal when the clock signal is at a high logic level. Further, the method includes receiving the at least one slave internal signal and generating an output signal.

Accordingly to the embodiments of the disclosure a Flip-flop for designing the low power integrated circuits (IC's) is provided. The Flip-flop includes a master latch configured to receive at least one of a clock signal, a data signal, and a complimentary data signal. The complimentary data signal is produced by an input data inverter present in the Flip-flop. Further, the master latch is configured to generate at least one master internal signal based on the received at least one of the clock signal, the data signal, and the complimentary data signal, when the clock signal is at a low logic level. Further, the Flip-flop includes a slave latch configured to generate at least one slave internal signal based on at least one of the clock signal and the at least one master internal signal, when the clock signal is at a high logic level. Further, the Flip-flop includes an output inverter driver configured to generate an output signal based on the generated at least one slave internal signal.

In an embodiment of the disclosure, the master latch is a p-type metal oxide semiconductor (PMOS) dominant and the slave latch is an n-type metal oxide semiconductor (NMOS) dominant.

Accordingly to the embodiments of the disclosure, a Flip-flop for designing the low power integrated circuits (IC's) is provided. The Flip-flop includes a master latch configured to receive at least one of a clock signal, a complimentary clock signal, a data signal, and a complimentary data signal. The complimentary clock signal is produced by a clock inverter present in the Flip-flop. The complimentary data signal is produced by a data inverter present in the Flip-flop. Further, the master latch configured to generate at least one master internal signal based on the received at least one of the clock signal, the complimentary clock signal, the data signal, and the complimentary data signal, when the clock is at a low logic level. Further, the Flip-flop includes a slave latch configured to generate at least one slave internal signal based on at least one of the received at least one master internal signal and the clock signal, when the clock signal is at a high logic level. Further, the Flip-flop includes an output inverter driver configured to receive the at least one slave internal signal and generate an output signal.

In an embodiment of the disclosure, the master latch is an n-type metal oxide semiconductor (NMOS) dominant and the slave latch is a p-type metal oxide semiconductor (PMOS) dominant.

The above and other aspects, features, and advantages of certain embodiments of the present disclosure will be more apparent and understood when considered in conjunction with the following description and the accompanying drawings. It should be understood, however, that the following descriptions, while indicating exemplary embodiments and numerous specific details thereof, are given by way of an illustration and not by way of a limitation. Many changes and modifications may be made within the scope of exemplary embodiments herein without departing from the spirit thereof, and exemplary embodiments herein include all such modifications.

BRIEF DESCRIPTION OF THE DRAWINGS

Various embodiments are illustrated in the accompanying drawings, throughout which same reference letters indicate corresponding parts in various figures. The various embodiments herein will be better understood from the following description with reference to the drawings, in which.

DETAILED DESCRIPTION OF EXEMPLARY EMBODIMENTS

In the following description, only certain exemplary embodiments, various features, and advantageous details thereof are explained more fully with reference to the accompanying drawings. Descriptions of well-known components and processing techniques are omitted so as to not unnecessarily obscure exemplary embodiments. The description herein is intended merely to facilitate an understanding of ways in which exemplary embodiments herein can be practiced and to further enable those of skill in the art to practice exemplary embodiments herein. Accordingly, this disclosure should not be construed as limiting the scope of exemplary embodiments.

Figure 1:
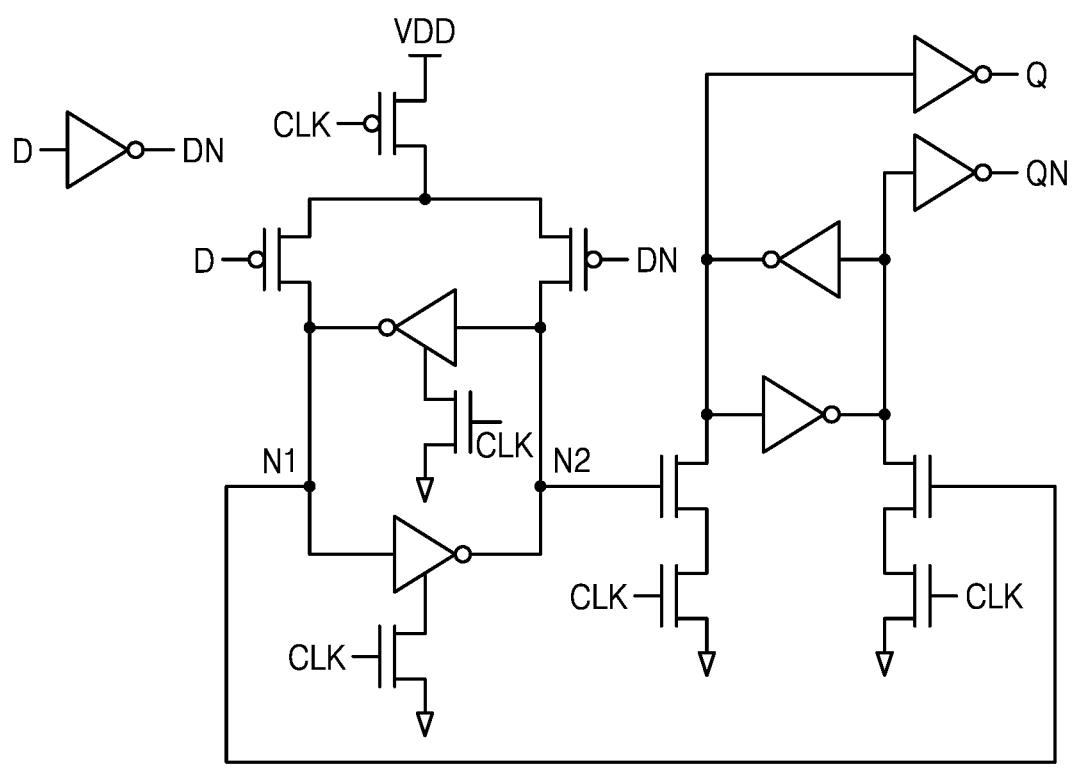
FIG. 1 is a related art Flip-flop circuit diagram.
Figure 2:
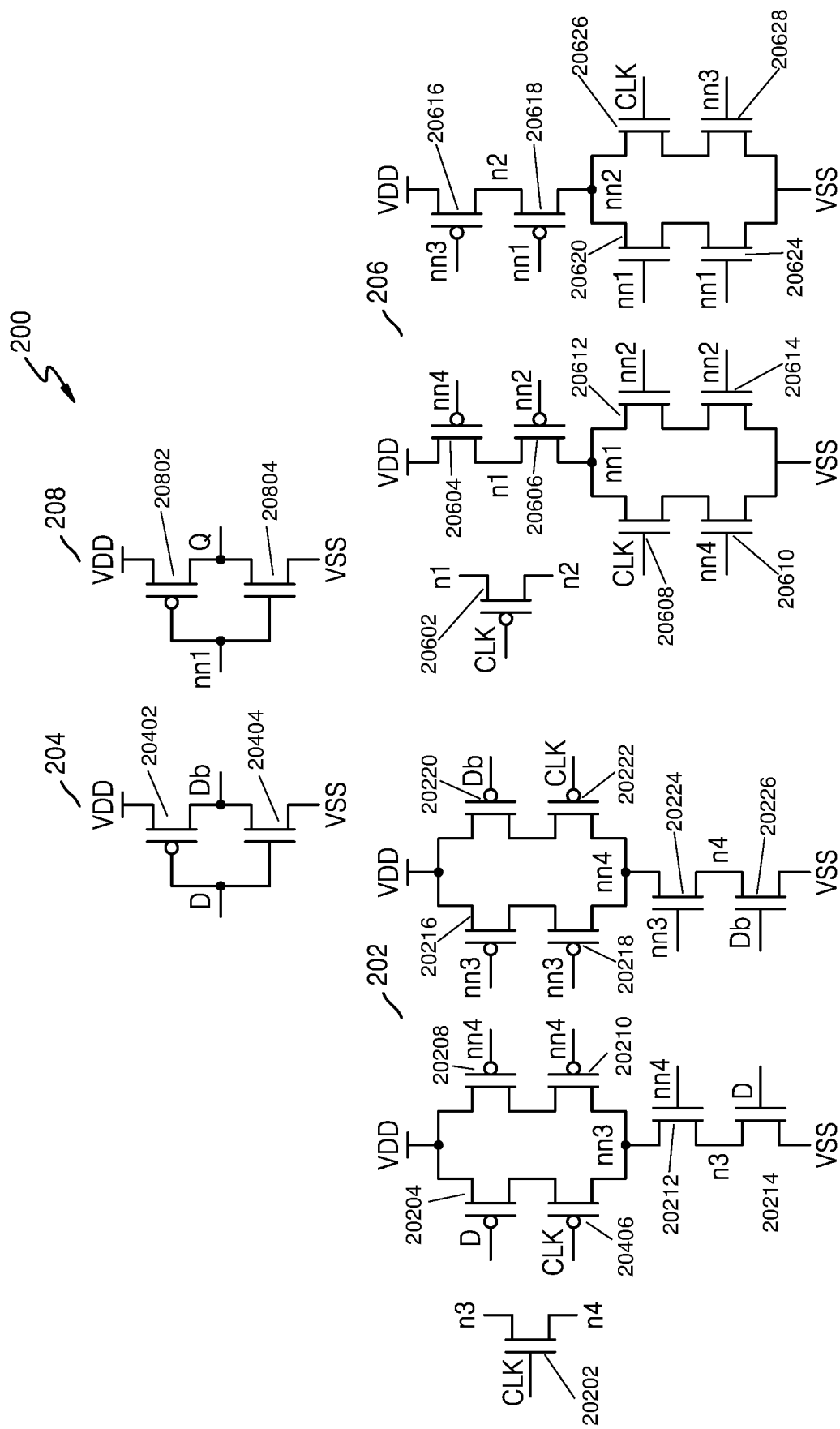
FIG. 2 is a block diagram illustrating a Flip-flop circuit design for optimizing clock power of low power integrated chips (ICs) according to an embodiment.
Figure 3:
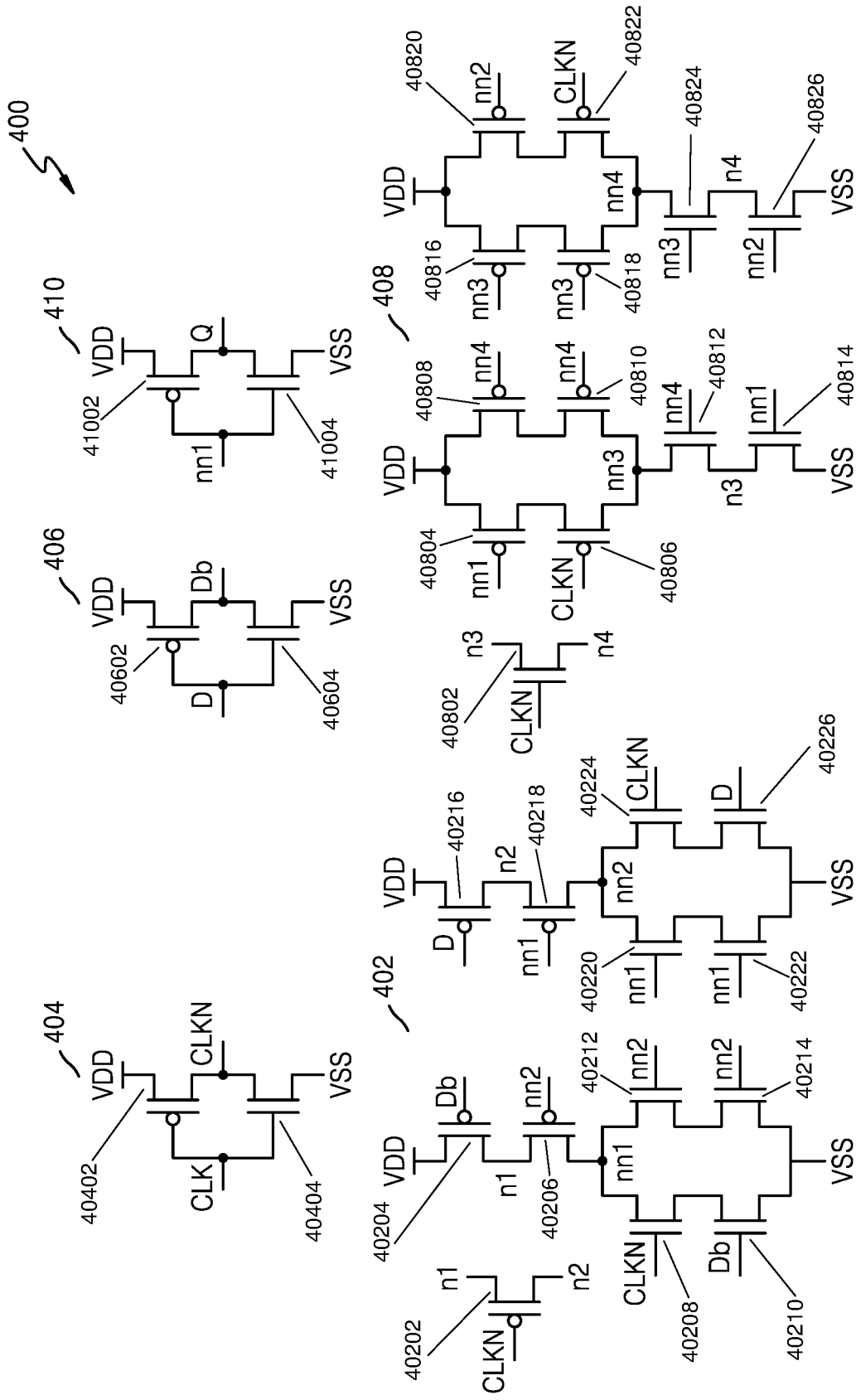
FIG. 3 is a block diagram illustrating a Flip-flop circuit design with clock inverter for optimizing clock power of low power integrated chips (ICs), according to an embodiment.

Exemplary embodiments herein achieve method and a Flip-flop circuit design for low power integrated circuits (IC's). The Flip-flop includes a master latch configured to receive at least one of a clock signal, a data signal and a complimentary data signal, where the complimentary data signal is produced by an input data inverter present in the Flip-flop. Further, the master latch configured to generate at least one master internal signal based on the received at least one of the clock signal, the data signal, and the complimentary data signal, when the clock signal is at a low logic level. Further, the Flip-flop includes a slave latch configured to generate at least one slave internal signal based on at least one of the received clock signal and the generated at least one master internal signal, when the clock signal is at a high logic level. Further, the Flip-flop includes an output inverter driver configured to generate an output signal based on the generated at least one slave internal signal. Referring now to the drawings, and more particularly to FIGS. 2 and 3, where similar reference characters denote corresponding features consistently throughout the figures, there are shown exemplary embodiments.

FIG. 2 is a Flip-flop 200 circuit design for optimizing clock power of low power integrated chips (ICs), according to an exemplary embodiment.

Exemplary embodiments herein provide a Flip-flop 200 circuit design for low power integrated circuits (IC's). The Flip-flop 200 includes a master latch 202 configured to receive at least one of a clock signal CLK, a data signal D, and a complimentary data signal Db, where the complimentary data signal Db is produced by an input data inverter 204 present in the Flip-flop 200. The master latch 202 is a p-type metal oxide semiconductor (PMOS) dominant. Further, the master latch 202 is configured to generate at least one master internal signal based on the received at least one of the clock signal CLK, the data signal D, and the complimentary data signal Db, when the clock signal CLK is at a low logic level.

Further, the Flip-flop 200 circuit design includes a slave latch 206 configured to generate at least one slave internal signal based on at least one of the received clock signal and the generated at least one master internal signal, when the clock signal CLK is at a high logic level. The slave latch 206 is an n-type metal oxide semiconductor (NMOS) dominant. Further, the Flip-flop 200 circuit design includes an output inverter driver 208 configured to generate an output signal based on the generated at least one slave internal signal.

The master latch 202 may include transistor 20202, transistor 20204, transistor 20206, transistor 20208, transistor 20210, transistor 20212, transistor 20214, transistor 20216, transistor 20218, transistor 20220, transistor 20222, transistor 20224 and transistor 20226.

The input data inverter 204 may include transistor 20402 and transistor 20404.

The slave latch 206 may include transistor 20602, transistor 20604, transistor 20606, transistor 20608, transistor 20610, transistor 20612, transistor 20614, transistor 20616, transistor 20618, transistor 20620, transistor 20622, transistor 20624 and transistor 20626.

The output inverter driver 208 may include transistor 20802 and transistor 20804.

For example, the input data inverter 204 present in the Flip-flop 200 generates the complimentary data signal Db from the data signal D. The Db is the inverted data signal hence Db and D signals are complimentary to each other. Further, the master latch 202 can be configured to generate at least one master internal signal based on the received at least one of the clock signal CLK, the data signal D, and the complimentary data signal Db, when the clock signal CLK is at a low logic level. Due to the generation of the at least one master internal signal, nodes nn4 or nn3 will pull-up. Further, the nodes nn3 and nn4 go to the slave latch 206. These nodes are complimentary to each other which means if nn3=one then nn4 should be zero. Further, when the clock signal CLK goes to high logic, node nn3 and nn4 can short and results in direct power supply. The slave latch 206 can inform and maintains the nodes nn3 and nn4 which helps in generating the output using the output inverter driver 208 present in the slave latch 206. Based on the nodes nn3 or nn4, nodes nn1 or nn2 can be discharge charged respectively. Further, the output inverter driver 208 can use the node nn1 to generate an output Q. The nodes nn1 or nn2 nodes can be maintained when the CLK goes low logic using the slave latch 206 and same cycle repeats, when a new data arrives in at CLK=0. FIG. 3 is a Flip-flop 400 circuit design with a clock inverter 404 for optimizing clock power of low power integrated chips (ICs), according to an exemplary embodiment.

Exemplary embodiments herein provide a method of designing a low power IC's using the Flip-flop 400. The method includes receiving at least one of a clock signal CLK, a complimentary clock signal CLKN, a data signal D, and a complimentary data signal Db, where the complimentary clock signal CLKN is produced by a clock inverter 404 present in the Flip-flop 400. The complimentary data signal Db is produced by the data inverter 406 present in the Flip-flop 400. Further, the method includes generating at least one master internal signal based on the received at least one of the clock signal CLK, the complimentary clock signal CLKN, the data signal D, and the complimentary data signal Db, when the clock is at a low logic level. Further, the method includes generating at least one slave internal signal based on at least one of the generated at least one master internal signal and the received clock signal, when the clock signal CLK is at a high logic level. Further, the method includes receiving the at least one slave internal signal and generating an output signal.

Exemplary embodiments herein provide the Flip-flop 400 for designing the low power IC's. The Flip-flop 400 includes a master latch 402 configured to receive at least one of the clock signal CLK, the complimentary clock signal CLKN, the data signal D, and the complimentary data signal Db. The complimentary clock signal CLKN is produced by the clock inverter 404 present in the Flip-flop 400. The complimentary data signal Db is produced by the data inverter 406 present in the Flip-flop 400. Further, the master latch 402 configured to generate at least one master internal signal based on the received at least one of the clock signal CLK, the complimentary clock signal CLKN, the data signal D, and the complimentary data signal Db, when the clock is at a low logic level. Further, the Flip-flop 400 includes a slave latch 408 configured to generate at least one slave internal signal based on at least one of the received at least one master internal signal and the clock signal CLK, when the clock signal CLK is at a high logic level. Further, the Flip-flop 400 includes an output inverter driver 410 configured to receive the at least one slave internal signal and generate an output signal. In an exemplary embodiment, the master latch is an n-type metal oxide semiconductor (NMOS) dominant and the slave latch is a p-type metal oxide semiconductor (PMOS) dominant. This Flip-flop 400 design is the complimentary version of the Flip-flop 200 in which master latch is NMOS based and slave latch is PMOS based.

The master latch 402 may include transistor 402, transistor 40204, transistor 40206, transistor 40208, transistor 40210, transistor 40212, transistor 40214, transistor 40216, transistor 40218, transistor 40220, transistor 40222, transistor 40224 and transistor 40226.

The clock inverter 404 may include transistor 40402 and transistor 40404.

The data inverter 406 may include transistor 40602 and transistor 40604.

The slave latch 408 may include transistor 40802, transistor 40804, transistor 40806, transistor 40808, transistor 40810, transistor 40812, transistor 40814, transistor 40816, transistor 40818, transistor 40820, transistor 40822, transistor 40824 and transistor 40826.

The output inverter driver 410 may include transistor 41002 and transistor 41004.

Exemplary embodiments disclosed herein can be implemented through at least one software program running on at least one hardware device and performing functions to control the elements. The elements shown in FIG. 2 and FIG. 3 can be at least one of a hardware device, or a combination of hardware device and software module.

The foregoing description explains various exemplary embodiments that others can, by applying current knowledge, readily modify and/or adapt such embodiments without departing from the generic concept of the present disclosure, and, therefore, such adaptations and modifications should and are intended to be comprehended within the meaning and range of equivalents of the disclosed embodiments. It is to be understood that the phraseology or terminology employed herein is for the purpose of description and not by way of a limitation. Therefore, while exemplary embodiments herein have been described, those skilled in the art will recognize that exemplary embodiments herein can be practiced with modification within the spirit and scope of the present description.

What is claimed is:

1. A method of configuring a low power integrated circuit (IC) using a flip-flop, the method comprising:
   receiving, by a master latch, a clock signal, a data signal, and a complimentary data signal that is produced by an input data inverter of the flip-flop;
   generating, by the master latch, when the clock signal is at a low logic level, a first master internal signal at a first node of the master latch and a second master internal signal at a second node of the master latch based on the clock signal, the data signal, and the complimentary data signal, the first master internal signal being complimentary to the second master internal signal; and
   electrically connecting a third node and a fourth node through an NMOS transistor when the clock signal is at a high logic level,
   wherein the first node and the second node are shorted for supplying power to the flip-flop when the clock signal is at the high logic level.

2. The method of claim 1, further comprising:
   when the clock signal is at the high logic level, generating, by a slave latch, at least one slave internal signal based on at least one of the received clock signal and the first master internal signal; and
   in response to receiving the generated at least one slave internal signal, generating, by an output inverter driver, an output signal.

3. The method of claim 1, wherein the master latch is a p-type metal oxide semiconductor (PMOS) dominant.

4. The method of claim 2, wherein the slave latch is an n-type metal oxide semiconductor (NMOS) dominant.

5. A method of configuring a low power integrated circuit (IC) using a flip-flop, the method comprising:
   receiving, by a master latch, a clock signal, a complimentary clock signal, a data signal, and a complimentary data signal, wherein the complimentary clock signal is produced by a clock inverter of the flip-flop and the complimentary data signal is produced by a data inverter of the flip-flop;
   generating, by the master latch, when the clock signal is at a low logic level, a first master internal signal at a first node of the master latch and a second master internal signal at a second node of the master latch based on the clock signal, the complimentary clock signal, the data signal, and the complimentary data signal, the first master internal signal being complimentary to the second master internal signal; and
   electrically connecting a third node and a fourth node through an NMOS transistor when the clock signal is at a high logic level,
   wherein the first node and the second node are shorted for supplying power to the flip-flop when the clock signal is at the high logic level.

6. The method of claim 5, further comprising:
   generating, by a slave latch, when the clock signal is at the high logic level, at least one slave internal signal based on the first master internal signal and the received clock signal; and
   receiving, by an output inverter driver, the at least one slave internal signal and generating an output signal.

7. The method of claim 5, wherein the master latch is an n-type metal oxide semiconductor (NMOS) dominant.

8. The method of claim 6, wherein the slave latch is a p-type metal oxide semiconductor (PMOS) dominant.

9. A flip-flop for a low power integrated circuit (IC), the flip-flop comprising:
   an input data inverter; and
   a master latch configured to:
      receive a clock signal, a data signal, and a complimentary data signal that is produced by the input data inverter;
      generate a first master internal signal at a first node of the master latch and a second master internal signal at a second node of the master latch based on the clock signal, the data signal, and the complimentary data signal, when the clock signal is at a low logic level, the first master internal signal being complimentary to the second master internal signal; and
      electrically connect a third node and a fourth node when the clock signal is at a high logic level,
   wherein the first node and the second node are shorted for supplying power to the flip-flop when the clock signal is at the high logic level.

10. The flip-flop of claim 9 further comprising:
   a slave latch configured to generate at least one slave internal signal based on the clock signal and the first master internal signal, when the clock signal is at is at the high logic level; and
   an output inverter driver configured to, in response to receiving the generated at least one slave internal signal, generate an output signal.

11. The flip-flop of claim 9, wherein the master latch is a p-type metal oxide semiconductor (PMOS) dominant.

12. The flip-flop of claim 10, wherein the slave latch is an n-type metal oxide semiconductor (NMOS) dominant.

* * * * *